United States Patent
Akiyama et al.

(10) Patent No.: US 6,921,726 B2
(45) Date of Patent: Jul. 26, 2005

(54) GROWING SMOOTH SEMICONDUCTOR LAYERS

(75) Inventors: Hidefumi Akiyama, Tokyo (JP); Loren Neil Pfeiffer, Morristown, NJ (US); Kenneth William West, Mendham, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/097,092

(22) Filed: Mar. 13, 2002

(65) Prior Publication Data

US 2003/0173559 A1 Sep. 18, 2003

(51) Int. Cl.[7] .............................................. H01L 21/31
(52) U.S. Cl. ...................... 438/767; 438/493; 438/761; 438/763
(58) Field of Search ................................ 438/761, 763, 438/767, 493

(56) References Cited

U.S. PATENT DOCUMENTS

| 4,370,510 | A | * | 1/1983 | Stirn | 136/262 |
| 5,106,771 | A | * | 4/1992 | Emerson et al. | 438/573 |
| 2002/0144725 | A1 | * | 10/2002 | Jordan et al. | 136/247 |
| 2003/0015700 | A1 | * | 1/2003 | Eisenbeiser et al. | 257/53 |

OTHER PUBLICATIONS

Hess, H.F. et al., "Near–Field Spectroscopy of the Quantum Constituents of a Luminescent System," SCIENCE, vol. 264, Jun. 17, 1994, pp. 1740–1745.

Wassermeier, M. et al., "Growth mechanism of GaAs on (110) GaAs studied by high–energy electron diffraction and atomic force microscopy," J. Vac. Sci. Technology B, vol. 12, No. 4, Jul./Aug. 1994, pp. 2574–2578.

Hansen, J. et. al: "Metamorphosis of a quantum wire into quantum dots" NATURE, vol. 390, Nov., 1997, pp. 54–57.

Tok, E.S. et. al: "Is the arsenic incorporation kinetics important when growing GaAs(001), (110)and (111)A films?" Applied Physics Letters, vol. 71, Dec. 1, 1997, pp. 3278–3280.

Yoshita, M. et. al: "Large terrace formation and modulated electronic states in (110)GaAs quantum wells" Physical Review B, vol. 63, 2001, pp. 075305-1–075305-9.

Holmes, D.M. et. al: "Surface evolution in GaAs(110) homoepitaxy: from microscopic to macroscopic morphology" Journal of Crystal Growth, vol. 192, (1998), pp. 33–46.

M. Yoshita, H. Akiyama, L.N. Pfeiffer, K.W. West, "Formation of Flat Monolayer–Step–Free (110) GaAs Surfaces by Growth Interruption Annealing during Cleaved–Edge Epitaxial Overgrowth", Jpn. J. Appl. Phys. vol. 40 (2001), Part 2, No. 3B, pp. L252–L254, Mar. 2001.

* cited by examiner

Primary Examiner—Tom Thomas
Assistant Examiner—N. Drew Richards
(74) Attorney, Agent, or Firm—John F. McCabe

(57) ABSTRACT

A method includes epitaxially growing a semiconductor layer with a free surface and performing an anneal that reduces atomic roughness on the free surface. The free surface has an orientation with respect to lattice axes of the layer for which atoms in flat regions of the free surface have more chemical bonds to the layer than do, at least, some of the atoms at edges of monolayer steps on the free surface.

14 Claims, 6 Drawing Sheets

GROWING SMOOTH SEMICONDUCTOR LAYERS

BACKGROUND

1. Field of the Invention

This invention relates to growing semiconductor layers and devices that incorporate such layers.

2. Description of the Related Art

Epitaxial methods grow layers by depositing atoms on a growth surface and allowing the deposited atoms to find stable attachment points by diffusing along the surface. Thus, epitaxial methods use a crystalline structure of an initial growth surface to orient growth of the crystalline layer being grown. While epitaxial methods produce relatively smooth layers, the final layers are not smooth on atomic-scales.

Rather epitaxially grown layers have various types of roughness, which are shown in FIG. 1. The first type of roughness is islands 10 on the growth surface 12. Deposition of an atom on a flat portion of the growth surface 12 forms such an island 10. The second type of roughness is a hole 14 in the growth surface. Evaporation of a deposited atom from a flat portion of the growth surface 12 forms such a hole 14. The third type of roughness is a step 16 on the growth surface 12. Cutting an initial growth surface typically causes a misalignment with underlying microscopic lattice planes and such misalignments produce steps 12. These types of roughness at atomic-scales are not completely removed by epitaxial growth.

SUMMARY

Various embodiments of methods produce semiconductor layers with smoother surfaces than those obtained by epitaxial growth. To make the surfaces smoother, the methods include annealing epitaxially grown layers at temperatures that activate surface-diffusivities of a portion of the surface atoms. The mobilized surface atoms rearrange themselves to significantly reduce the amount of surface roughness at atomic scales. In some embodiments, the annealed surfaces are atomically smooth.

One embodiment features a method that includes epitaxially growing a semiconductor layer with a free surface and performing an anneal that reduces atomic roughness on the free surface. The free surface has an orientation with respect to lattice axes of the layer for which atoms in flat regions of the free surface have more chemical bonds to the layer than do some atoms at edges of monolayer steps on the free surface.

Another embodiment features a method that includes epitaxially growing a layer of a semiconductor on a smooth surface of a substrate and performing an anneal that reduces atomic roughness on a free surface of the grown layer. The growing is stopped as an average surface height that corresponds to an integer number of monolayers.

Another embodiment features a quantum well structure. The quantum well structure includes first and second barrier semiconductor layers and a well semiconductor layer having atomically smooth interfaces with the barrier layers. A 110-type or 111-type crystal axis of the well layer is perpendicular to the interfaces.

DETAILED DESCRIPTION OF THE EMBODIMENTS

Herein, a surface is smooth at atomic-scales if the surface does not have islands, holes, or steps that are one or more molecular monolayer in height. For surfaces made by methods herein atomic-scale smoothness typically exists over areas of one or more microns ($\mu$m) squared and preferably, over areas of at least 25 $\mu$m$^2$.

Figure 1:
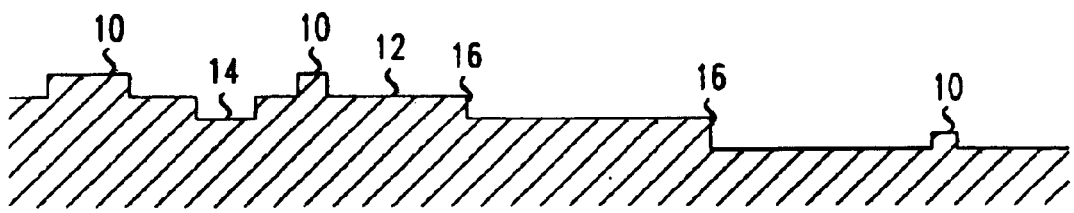
FIG. 1 is a cross-sectional view of an atomically rough surface that was grown by conventional molecular beam epitaxy (MBE)
Figure 2:
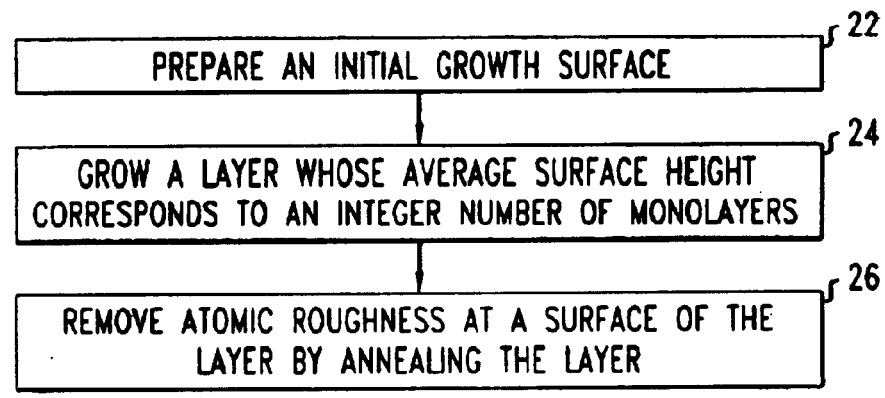
FIG. 2 is a flow chart illustrating a method for producing smooth surfaces at atomic scales.

FIG. 2 illustrates a method 20 for producing a semiconductor or dielectric layer that is smooth at atomic-scales. The method 20 includes preparing an initial growth surface that is approximately smooth on atomic scales (step 22). The initial surface is perpendicular to an underlying low-index lattice direction to an alignment accuracy of about 0.01 degrees or better. For this alignment accuracy, the initial surface is made either by cutting and polishing a crystal or by cleaving the crystal. This alignment accuracy leads to about one or less monolayer step per $\mu$m in the direction of maximal vicinal misalignment.

On the initial growth surface, the method 20 includes epitaxially growing a layer whose average surface height corresponds to an integer number of atomic monolayers (step 24). Herein, an average surface height of a layer corresponds to an integer number of monolayers if atoms thereon can be rearranged to produce a surface that is smooth on atomic-scales, i.e., without steps, holes, or islands. Stopping the growth of the layer at an integral number of monolayers is typically based on measurements of scattering of electrons off the surface at a grazing angle. The electrons used in such measurements have energies of 1 kilo electron volt (Kev) or more and preferably have energies between about 8 Kev and about 15 Kev.

Figure 3:
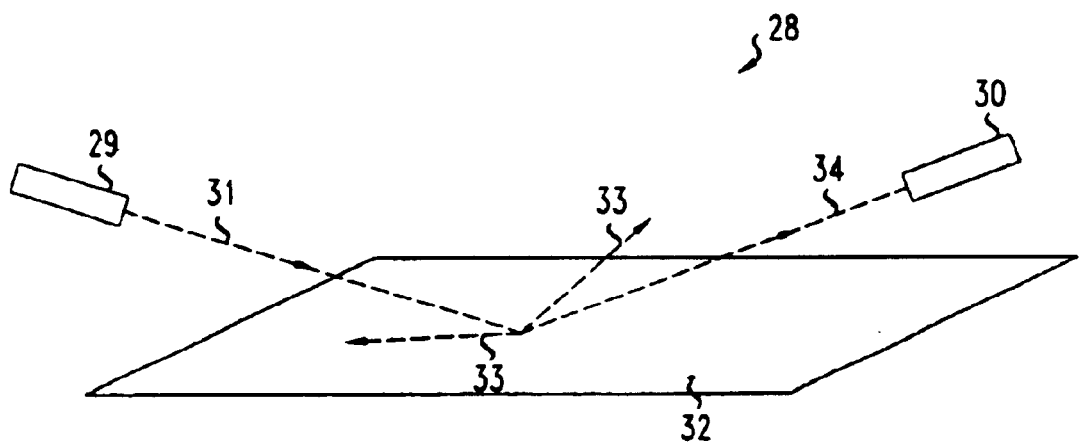
FIG. 3 shows a reflection high-energy electron diffraction (RHEED) system for measuring the average number of monolayers grown by the method of FIG. 2.

FIG. 3 shows a reflection high-energy electron diffraction (RHEED) system 28 that determines whether the average surface height of a growing layer corresponds to an integer number of atomic monolayers. The RHEED system 28 includes a collimated and monochromatic electron source 29 and an electron detector 30. The source 29 directs a collimated electron beam 31 obliquely towards the growing surface 32, e.g., at a grazing angle of about 1 degree or less. In the electron beam 31, electrons have energies between of about 1–20 Kev and preferably of about 8–15 Kev. The growing surface 32 diffractively scatters a portion 33 of the incident electron beam 31 and specularly reflects a portion 34 of the incident electron beam 31. Herein, specular reflection refers to forward scattering at an angle of reflection that equals the angle of incidence of the electron beam 31 on the growing surface 32. The electron detector 30, e.g., a phosphor screen with a photocell, is positioned to detect the portion 33 of the incident electron beam 31 that is specularly reflected.

As growing surface 32 approaches an average surface height that corresponds to an integral number of monolayers, specular reflection increases. The amount of specular reflection increases, because the growing surface 32 becomes smooth over regions whose linear dimensions are of order of or larger than the effective coherence length of the electrons in the electron beam 31. Stopping the growth at a relative maximum in the time-dependent flux of specularly reflected electrons produces a final growth surface 32 whose average height corresponds to an integral number of atomic monolayers.

Figure 4:
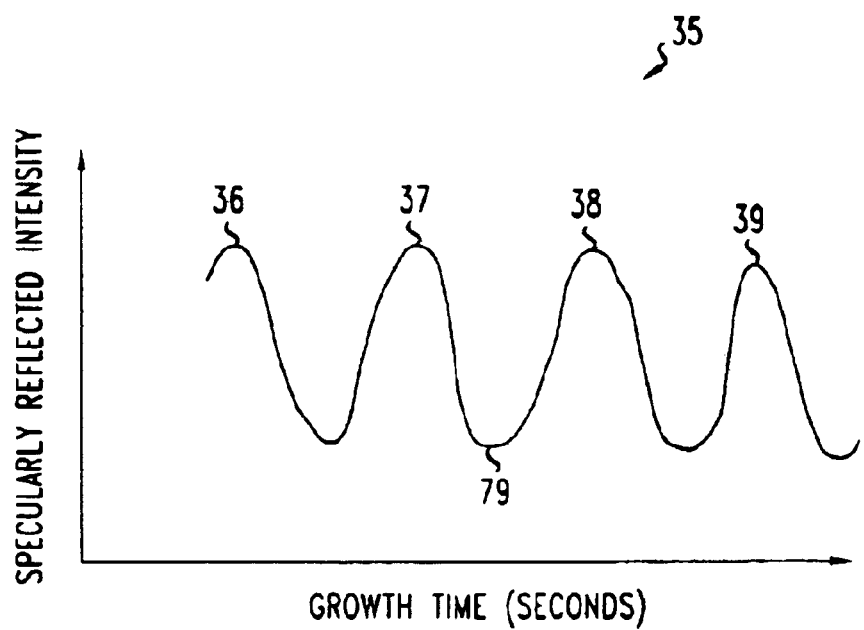
FIG. 4 is a graph of the time-dependent flux of specularly reflected electrons that would be measured by RHEED system of FIG. 3 during an MBE growth.

FIG. 4 provides a graph 35 that illustrates the time-dependence of the flux of specularly reflected electrons during the epitaxial growth of surface 32 of FIG. 3. The graph 35 has relative maxima 36, 37, 38, and 39 that correspond, respectively, to surfaces with N, N+1, N+2, and N+3 monolayers with N equal to an integer. The relative maxima 36-39 are associated with surfaces whose average heights correspond to integer numbers of monolayers, because diameters of atomically smooth regions on such surfaces are, at least, of the order of the coherence length of incident electrons in the electron beam 31. A surface having atomically smooth regions of such diameters specularly reflects a significant portion of the electrons incident thereon.

Referring to FIG. 2, method 20 includes reducing or removing atomic roughness on a free surface of the epitaxially grown layer by annealing the layer at a temperature above the growth temperature (step 26). The annealing activates surface-diffusivities of a proper subset of the surface atoms, i.e., of atoms located at edges of monolayer steps on the surface. The atoms with activated surface-diffusivities are able to move away from the edges of monolayer steps and fill holes in the surface thereby becoming more strongly bonded. Thus, thermally activated surface-diffusion reduces atomic roughness.

At step 24, the epitaxial growth was along a lattice direction for which a proper subset of the surface Ga atoms has thermally activatable surface-diffusivities. For gallium (Ga) arsenide (As) layers, thermally activatable surface-diffusivities exist for a proper subset of the surface Ga atoms if the epitaxial growth direction is along 110-type or 111-type crystal axes. Herein, 110-type crystal axes include lattice directions 110, 101, 011, 1-10, 10-1, 01-1, and 111-type crystal axes include lattice directions 111, -111, 1-11, 11-1. If a GaAs layer is grown along either 110-type or 111-type crystal axes, some of the surface Ga atoms of the layer are bonded by 2 chemical bonds, and some of the surface Ga atoms of the layer are bonded by 3 chemical bonds. The 2-bonded Ga atoms are located at edges on the surface, and the 3-bonded Ga atoms are located in flat regions on the surface. The 2-bonded Ga atoms have significantly higher surface-diffusivities than 3-bonded Ga atoms for temperatures of about 570° C. or higher. At these temperatures, 2-bonded Ga atoms readily diffuse along the surface until such atoms find and fill a hole in the surface thereby forming 3 chemical bonds. Thermally activated surface-diffusion reduces the number of Ga atoms bonded at edges and increases the number of Ga atoms bonded in flat portions of the surface thereby reducing atomic-scale roughness.

In contrast to GaAs layers grown along 110-type or 111-type crystal axes, GaAs layers grown along the 100 crystal axes, i.e., 100, 010, or 001 lattice directions, do not include both a population of 2-bonded surface Ga atoms and a population of 3-bonded surface Ga atoms. Instead, all surface Ga atoms in these layers have 2 chemical bonds independently of whether the atoms are located at edges or in flat regions of the surface. Due to the absence of both 2-bonded and 3-bonded surface Ga atoms, surface-diffusivities of differently positioned surface Ga atoms are equally temperature activatable for GaAs layers grown along 100 crystal axes. Annealing 100 GaAs layers still does reduce surface roughness, because energies are reduced by minimizing surface areas. But, a lack of atoms that are more strongly bonded in flat portions than at edges of monolayer steps on the surface eliminates the driving force to smooth the surface at atomic scales.

GaAs is a group III/V semiconductor with a zinc blend cubic-lattice structure. Other group III/V semiconductor have the zinc blend cubic-lattice structure and will have similar properties. In particular, surfaces of other group III/V semiconductors, which have been epitaxially grown along 110-type or 111-type crystal axes, also include 2-bonded atoms at edges on the surface and 3-bonded atoms in flat portions of the surface. Thus, a proper subset of the surface atoms of group III/V semiconductors will have temperature-activatable surface-diffusivities. Annealing epitaxially grown layers of such III/V semiconductors causes surface atoms to redistribute themselves in a manner that reduces or removes atomic surface roughness. For this reason, method 20 of FIG. 2 is able to produce atomically smooth layers of other group III/V semiconductors if epitaxial growth is along 110-type or 111-type crystal axes.

The method 20 of FIG. 2 is also capable of producing atomically smooth crystalline layers of semiconductors with non-zinc blend crystal structures. The method 20 produces an atomically smooth surface if atoms at some types of edges of monolayer steps of a layer's surface have fewer chemical bonds to the crystalline layer than do, at least, some atoms in flat regions of the layer's surface. For such surfaces, annealing enables weakly bonded atoms at edges of monolayer steps to diffuse to stronger binding sites in flat regions of the surface and thereby reduce surface roughness.

Figure 5:
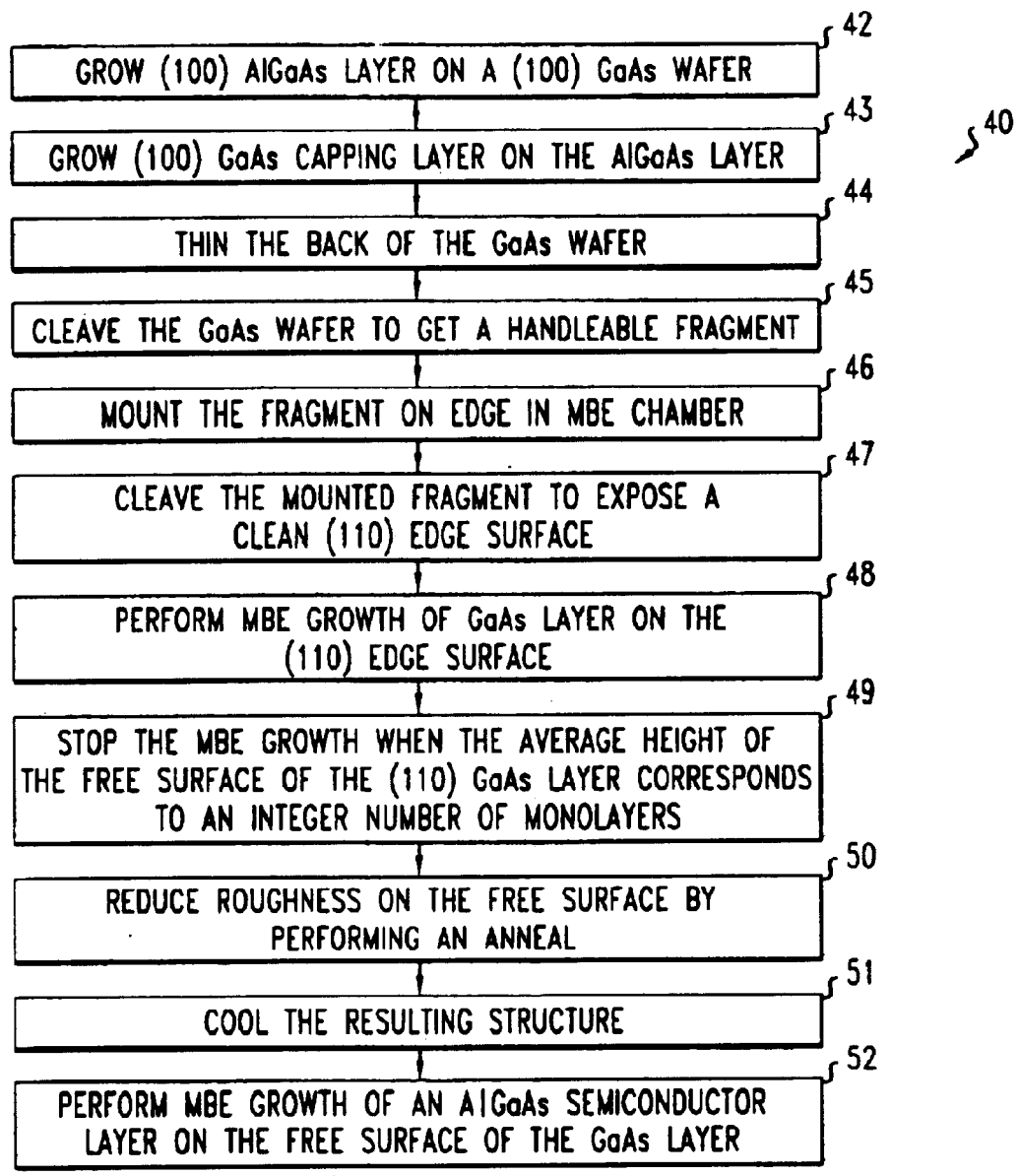
FIG. 5 is a flow chart that illustrates a method for growing a quantum well structure with interfaces that are smooth on an atomic scale.
Figure 6:
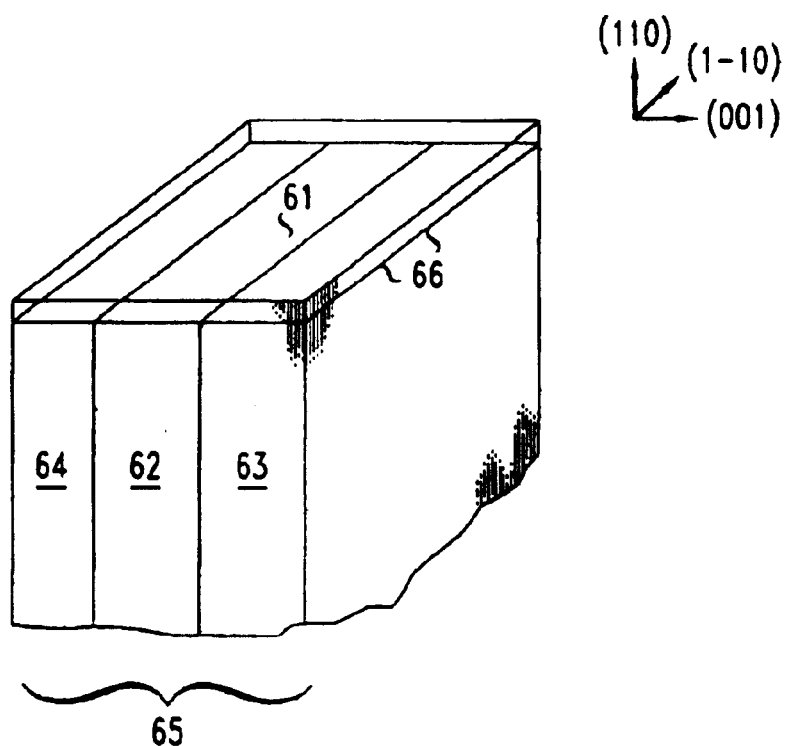
FIG. 6 is an oblique view of an AlGaAs substrate used to grow smooth layers in the method of FIG. 5.

FIG. 5 illustrates a method 40 for growing an aluminum (Al)GaAs/GaAs/AlGaAs quantum well structure with smooth interfaces. The quantum well structure includes an AlGaAs substrate 62 and GaAs well layer 61 shown in FIG. 6. Both the interface between the GaAs and AlGaAs layers 61, 62 and the free surface of the GaAs layer 61 are smooth at atomic-scales.

Method 40 includes producing an initial (110) growth surface on the $Al_{0.29}Ga_{0.71}As$ substrate 62, i.e. a surface smooth at atomic-scales. To produce the initial growth surface, a MBE grows a (100) $Al_{0.29}Ga_{0.71}As$ layer 62 on a 2-inch wide (100) GaAs wafer 63 (step 42). Prior to growing the $Al_{0.29}Ga_{0.71}As$ layer 62, the MBE grows a buffer layer, e.g., 0.5 nm of GaAs, on the (100) GaAs wafer 63. Exemplary $Al_{0.29}Ga_{0.71}As$ layers 62 and GaAs wafers 63 have thicknesses of about 6.8 $\mu$m and about 500 $\mu$m, respectively.

After growing the (100) $Al_{0.29}Ga_{0.71}As$ layer 62, another MBE step grows a (100) GaAs capping layer 64 over the (100) $Al_{0.29}Ga_{0.71}As$ layer 62 (step 43). After growing the GaAs capping layer 64, the method 40 includes thinning a back surface of the GaAs wafer 63 to a thickness of about 100 µm to prepare the structure for cleaving (step 44). The method 40 includes edge-cleaving the resulting GaAs/AlGaAs/GaAs structure in air to form a fragment 65 with a more handeable size, e.g., a square of about 1 cm² (step 45). The fragment 65 is mounted on-edge in an MBE chamber (step 46). Then, an edge cleave of the mounted fragment, i.e., in the MBE vacuum, along line 66 produces a clean (110) AlGaAs edge surface (step 47). The clean (110) AlGaAs edge surface is found to be a smooth on atomic-scales over areas of 100s of µm².

On the clean (110) AlGaAs edge surface, method 40 includes performing an MBE growth of a (110) GaAs well layer 61 (step 48). To produce gallium and arsenic atoms for the MBE deposition, gallium and arsenic sources are heated to about 1000° C. and about 300° C., respectively. During the MBE deposition, the temperature of the substrate, i.e. fragment 65, is maintained between about 470° C. and about 505° C. and preferably between about 480° C. and about 490° C. In response to determining that the average surface height of the grown GaAs layer 61 corresponds to an integer number of atomic monolayers, the method 40 includes stopping further growth by blocking the flow of Ga into the MBE chamber (step 49). To determine whether the average surface height corresponds to an integer number of monolayers, RHEED system 28 of FIG. 3 measures the time-dependent flux of specularly reflected electrons. A peak value in the measured flux corresponds to an integer number of monolayers. After stopping the MBE growth, the free surface of the GaAs layer 61 is still rough at atomic-scales.

After stopping the growth, method 40 includes reducing or completely removing atomic-scale roughness on the free surface of the (110) GaAs layer 61 by performing an anneal (step 50). The anneal entails heating GaAs/AlGaAs/GaAs structure 65 to a temperature of about 570° C. or higher and preferably to at temperature of about 600° C. or higher in an $As_4$ beam flux and maintaining these conditions for about 10 minutes. Exemplary anneals at about 600° C. maintain an overpressure of $As_4$ in the MBE chamber to compensate for possibly higher evaporation rates of arsenic atoms from the free surface of the GaAs layer 61. The anneal activates diffusivities of some Ga atoms or effectively pairs of Ga and As atoms on the free surface, e.g., for Ga atoms at edges of monolayer-steps in the surface height. The Ga atoms or pairs of Ga and As atoms have activated surface-diffusivities and are able to move along the surface until ultimately incorporating into the surface at 3-bond sites thereby smoothing out atomic roughness. After the anneal, the free surface of the (110) GaAs layer 61 is smooth at atomic-scales, because the MBE growth stopped at an average surface height that corresponds to an integral number of GaAs-molecular monolayers epitaxially deposited on an atomically smooth (110) cleaved surface.

After the finishing the anneal, method 40 includes cooling the resulting semiconductor structure 65 down to a temperature in the range of about 470° C. to about 505° C. and preferably in the range of about 480° C. to about 490° C. (step 51). Then, the method 40 includes performing an MBE growth of a barrier semiconductor layer such as a (110) layer of $Al_{1-x}Ga_xAs$, e.g., x≈0.71, on the free surface of the GaAs layer 61, at the same temperature (step 52). The AlGaAs layer has an atomically smooth interface with the underlying GaAs layer, because the free surface of the initial GaAs layer was atomically smooth and remains smooth during the AlGaAs (110) overgrowth. Growth of the AlGaAs (110) layer does not produce exchanges of Al and Ga atoms across the interface with the underlying GaAs layer at these comparatively low growth temperatures.

Figure 7:
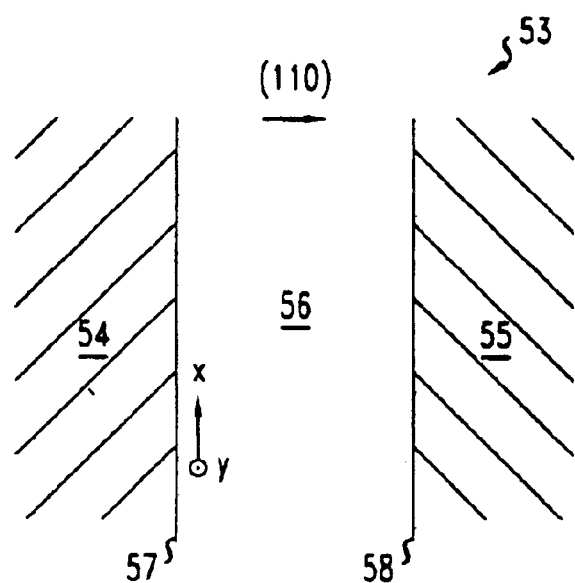
FIG. 7 is a cross-sectional view of a quantum well structure grown by the method of FIG. 5.

Method 40 produces quantum well structure 53, which is shown in cross-sectional view in FIG. 7. The quantum well structure 53 has crystalline lateral AlGaAs barriers 54, 55 and a crystalline GaAs well region 56. The GaAs well region 56 has a (110) underlying lattice direction that is perpendicular to interfaces 57, 58 with the AlGaAs barriers 54, 55. Both interfaces 57, 58 between the GaAs well region 56 and the AlGaAs barriers 54, 55 are smooth at atomic-scales. Due to this smoothness, lateral dimensions of the quantum well structure 53 are constant along the interfaces 57, 58 themselves. Thus, the quantum well structure 53 has constant lateral dimensions along the X- and Y-axes that define positions along the interfaces 57, 58. The constant lateral dimensions produce discrete energy levels with the narrowest obtainable widths in the quantum well structure 53.

Figure 8A:
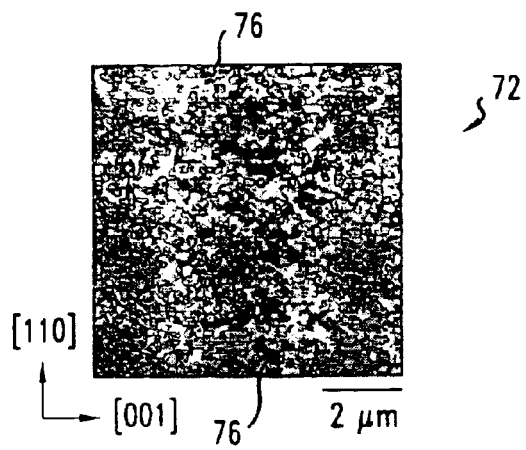
FIG. 8A is a top view of the free surface of a GaAs layer grown by MBE.
Figure 8B:
FIG. 8B is a top view of the free surface of another GaAs layer produced by the MBE growth of FIG. 8A followed by a surface-diffusion activating anneal.

FIGS. 8A and 8B provide atomic force microscope pictures of free surfaces 72, 74 of first and second 6.0 µm thick (110) GaAs layers produced by an MBE and by an MBE followed by a surface-diffusivity activating anneal, respectively. The production of both surfaces used identical MBE growths and have average heights that correspond to an integer number of monolayers, i.e., 30 monolayers. In the top views of surfaces 72, 74, light and dark regions correspond to different surface heights.

FIG. 8A is a top view of a square 5 µm×5 µm region of free surface 72. The square region has a dense covering of bumps/holes 76. Average separations between the bumps/holes are less than about 200–400 nm. This average separation corresponds to a density of about 6–25 holes/bumps per µm². The deepest holes 76 and highest bumps 76 also have height differences of two or more monolayers with respect to the average height of the surface 72.

FIG. 8B is a top view of a square 5 µm×5 µm region of the free surface 74. The square region is free of bumps/holes. Thus, the anneal producing the surface 74 has reduced the density of the bumps/holes to about 0.04 or less per µm² and also has reduced maximum height variations to less than 1 monolayer. In FIG. 8B, gradual variations in lightness are systematic artifacts of the measurements.

Both the density of holes/bumps and the maximum variation of surface height provide measures of the roughness of a surface. The differences between the top views of free surfaces 72 and 76 illustrate that the surface-diffusion activating anneal significantly reduced surface roughness. The activation of surface-diffusivities of atoms at edges of monolayer steps is higher than that of atoms in flat regions of a surface. For that reason, the roughness of a grown surface that was subsequently annealed is lower than the roughness of a grown surface that was not annealed.

Figure 8C:
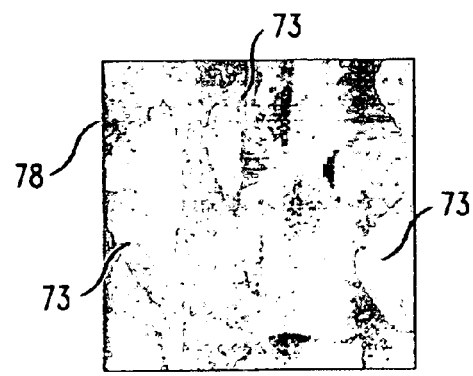
FIG. 8C is a top view of a surface of a GaAs layer produced by annealing a an MBE grown layer that stopped halfway between average surface heights associated with adjacent integer numbers of monolayers.

FIG. 8C shows an atomic force microscopy picture of a free surface 78 of another (110) GaAs layer. The GaAs layer was produced by performing an MBE growth to an average surface height that is halfway between successive integer numbers of monolayers and then, annealing the GaAs layer. The average surface height of this GaAs layer corresponds to a relative minimum 79, as shown in FIG. 4, for the flux of specularly reflected electrons as measured by electron detector 30 of FIG. 3. For the surface 78, the anneal has reduced the density of bumps/holes 73 to about 10 or less in a 5 µm×5 µm region as compared to 6 or more bumps/holes per µm² on the surface produced by a MBE alone (not shown).

Figure 9:
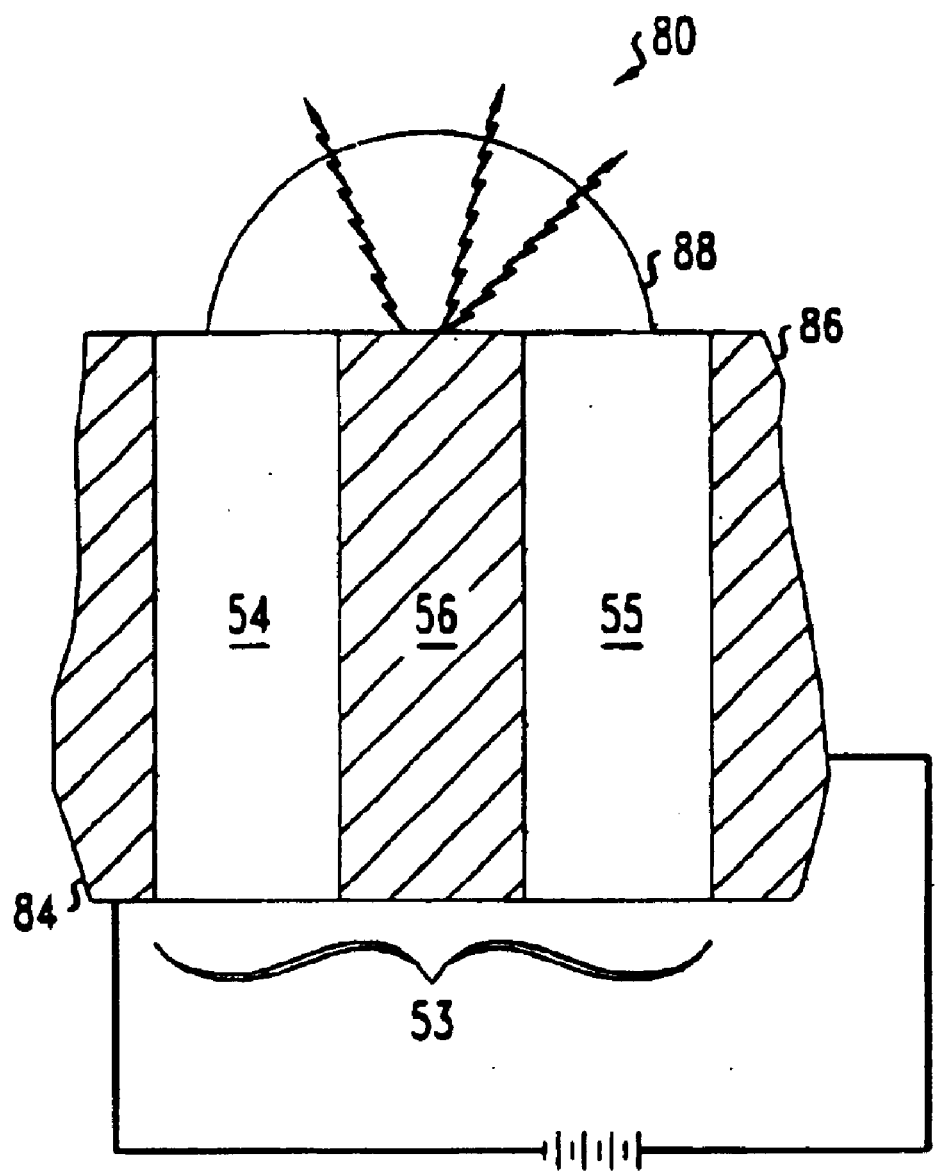
FIG. 9 shows an electro-optical device that uses a quantum well structure with atomically smooth interfaces.

FIG. 9 shows an electro-optical device 80 that includes a quantum well structure 53 of FIG. 7 and 53 and metallic contacts 84, 86 positioned on opposite sides of the quantum well structure 53. In the device 80, the quantum well structure 53 has an n-doped AlGaAs barrier 54, a p-doped AlGaAs barrier 55 and a crystalline GaAs well region 56 located between the AlGaAs barriers 54, 55. The GaAs well region 56 has atomically smooth interfaces 57, 58 with the AlGaAs barriers 54, 55. The metallic contacts 84, 86 provide a pumping current along the z-axis through the quantum well structure 53. The pumping current produces a population of charge carriers both in the valence band and in the conduction band of the quantum well structure 53. The valence and conduction band carriers combine in mutual annihilation in layer 53, which causes bandgap light to be emitted through the transparent window 88.

In various embodiments of the electro-optical device 80, such state transitions are either spontaneous or responsive to optical stimulation. Thus, exemplary electro-optical devices 80 include diodes and semiconductor lasers. In both embodiments, the smoothness of the interfaces 57, 58 of the quantum well structure 53 make the optical emission lines have unprecedentedly narrow line widths, i.e., the narrowest line widths obtainable.

Other embodiments of the invention will be apparent to those of skill in the are in light of the specification, drawings, and claims of this application.

We claim:

1. A method, comprising:
    epitaxially growing a semiconductor layer with a free surface, the free surface having an orientation with respect to lattice axes of the layer for which some atoms in flat regions of the free surface have three chemical bonds to the layer and, at least, some of the atoms at edges of monolayer steps on the free surface have two chemical bonds to the layer; and
    performing an anneal that reduces atomic roughness on the free surface; and
    wherein the performing an anneal comprises annealing the layer at a temperature above a temperature during the epitaxially growing step.

2. The method of claim 1, wherein the growing includes stopping the growth at an average surface height that corresponds to an integer number of monolayers.

3. A method comprising:
    epitaxially growing a semiconductor layer with a free surface, the free surface having an orientation with respect to lattice axes of the layer for which some atoms in flat regions of the free surface have three chemical bonds to the layer and, at least, some of the atoms at edges of monolayer steps on the free surface have two chemical bonds to the layer;
    performing an anneal that reduces atomic roughness on the free surface; and
    measuring a time-dependent rate of specular reflection off the growing semiconductor layer; and
    wherein the growing includes stopping the growth in response to a selected measurement of the rate of specular reflection.

4. The method of claim 3, wherein the selected measurement indicates that a specular reflection intensity has a relative maximum as a function of growing time.

5. The method of claim 1, further comprising:
    cleaving a crystalline substrate to form an edge surface; and
    wherein the epitaxially growing causes the semiconductor layer to grow on the edge surface.

6. The method of claim 1, wherein the growing includes growing a layer of one of a group III/V semiconductor and a semiconductor with a non-cubic lattice.

7. The method of claim 1, wherein the growing includes growing a GaAs layer along one of a 110-type crystal axis of GaAs and a 111-type crystal axis of GaAs.

8. The method of claim 7, wherein the layer is grown on a substrate that includes aluminum, gallium and arsenic.

9. The method of claim 1, further comprising:
    epitaxially growing a layer of a different semiconductor on the annealed layer.

10. A method comprising:
    epitaxially growing a semiconductor layer with a free surface, the free surface having an orientation with respect to lattice axes of the layer for which some atoms in flat regions of the free surface have three chemical bonds to the layer and, at least, some of the atoms at edges of monolayer steps on the free surface have two chemical bonds to the layer; and
    performing an anneal that reduces atomic roughness on the free surface; and
    wherein the growing includes growing a GaAs layer along a 110-type crystal axis of GaAs; and
    wherein the performing an anneal comprises heating the GaAs layer to a temperature of 570° C. or more; and
    wherein the performing an anneal comprises maintaining the temperature of 570° C. or more for 10 minutes.

11. The method of claim 1, wherein the growing includes growing the layer along a 110-type crystal axis.

12. The method of claim 11, wherein the layer includes gallium and arsenic.

13. The method of claim 1, wherein the growing includes growing the layer along a 111-type crystal axis.

14. The method of claim 13, wherein the layer includes gallium and arsenic.

* * * * *